United States Patent [19]

Eaton, Jr.

[11] 3,742,248

[45] June 26, 1973

[54] FREQUENCY DIVIDER

[75] Inventor: Sargent Sheffield Eaton, Jr., Phillipsburg, N.J.

[73] Assignee: RCA Corporation, Princeton, N.J.

[22] Filed: Oct. 26, 1971

[21] Appl. No.: 192,242

[52] U.S. Cl. .................................. 307/225, 307/216

[51] Int. Cl. .......................................... H03k 21/00

[58] Field of Search .................... 307/203, 215, 216, 307/218, 220, 225, 226, 205, 221 C, 251, 279, 304

[56] References Cited

UNITED STATES PATENTS

| | | | |
|---|---|---|---|
| 3,104,327 | 9/1963 | Rowe | 307/215 |
| 3,267,295 | 8/1966 | Zuk | 307/221 C |
| 3,601,629 | 8/1971 | Cricchi | 307/279 |
| 3,602,732 | 8/1971 | Suzuki | 307/216 |
| 3,634,658 | 1/1972 | Brown | 307/216 |

OTHER PUBLICATIONS

Rowe "B" "The Transistor NOR Circuit" 8-23-57 pages 231-245 1957 IRE Wescon Record Part 4

Richards "Arithmetic Operations in Digital Computers" 1955 Boolean Algebra pages 47,48 Scientific Lib TK 7888.3 R5 c.4

Lohman "Metal-Oxide Semiconductors To Switching Circuits" May-64 SCP and Solid State Technology pages 31-34

Mathias "Static Switching Circuits" May-1957 Control Engineering pages 80-84 Copy in SPE 254 FIKE Ahrons "NDRO Memory Cell Employing Insulated-Gate F.E.Ts" RCA Tech Notes No. 654 Nov.-1965 pages 1&2

*Primary Examiner*—John W. Huckert
*Assistant Examiner*—R. E. Hart
*Attorney*—H. Christoffersen

[57] ABSTRACT

A circuit utilizing either two cross-coupled exclusive OR or two cross-coupled exclusive NOR logic gates and which functions as a frequency divider. By establishing appropriate operating conditions for the logic gates, the circuit is forced into a frequency division condition, e.g. a divide-by-two condition.

10 Claims, 4 Drawing Figures

INVENTOR.
Sargent S. Eaton, Jr.
BY
G. Donald Weber, Jr.
ATTORNEY

INVENTOR.
Sargent S. Eaton, Jr.
BY
J. Donald Weber, Jr.
ATTORNEY

FREQUENCY DIVIDER

BACKGROUND

A large number of frequency dividing circuits are known in the art. These circuits are frequently utilized in counting circuits or the like.

Many of the known frequency dividing circuits are fabricated using integrated circuit techniques such as metallic oxide semiconductors (MOS) or the like. However, many of the existing frequency dividing circuits utilize a relatively large number of transistors or other semiconductor devices. Typically, a large number of semiconductor devices requires a relatively large area of the integrated circuit as well as having relatively high power dissipation requirements.

With the advent of integrated circuit techniques and the application of this technology to horologic devices such as wristwatches and the like, it is desirable to reduce the power dissipation as well as the area of the circuit chip or device. Consequently, it is highly desirable to devise counting or timing circuits which use fewer transistors or similar semiconductor devices in order to minimize the size and power requirements of the circuitry. That is, the smaller the requirements of area and/or power requirements or dissipation for the circuits, the smaller the timepiece or the like may be fabricated. Moreover, inasmuch as most proposed solid state watches of the type utilizing MOS type circuitry operate on a count down or frequency dividing principal, it is highly desirable to minimize the size and power requirements of counter and frequency divided circuits.

SUMMARY OF THE INVENTION

A pair of exclusive OR logic circuits (or a pair of exclusive NOR logic circuits) are connected in cross-coupled relationship whereby the output of each of the gates feeds an input of the other gate. A common input signal having a frequency F is supplied to another input of each of the logic gates. An output of frequency F/2 is obtained at the output of either of the aforesaid pair of gates.

The exclusive OR logic gates (or exclusive NOR logic gates) can be fabricated utilizing known MOS circuit techniques. By properly establishing the relative impedances of the several MOS devices, specific operation of the frequency dividing network may be implemented.

DESCRIPTION OF THE PREFERRED EMBODIMENT

Figure 1:
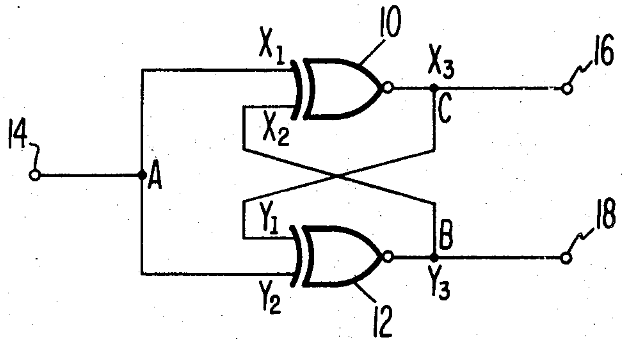
FIG. 1 is a schematic diagram, in logic diagram form, of one embodiment of the instant invention.

In the several figures described hereinafter, similar elements bear similar reference numerals.

Referring now to FIG. 1, there is shown one embodiment of the instant invention. This embodiment utilizes a pair of exclusive NOR gates 10 and 12. It should be understood that exclusive OR gates could be utilized in this circuit. Terminal 14 represents any suitable input source or means for supplying signals to be counted down or divided. For use in timing or as a frequency divider, the source is one which supplies a periodic input signal of frequency F and the circuit will be so described hereinafter. Input terminal 14 is connected to the X1 input of gate 10 and to the Y2 input of gate 12. The output X3 of NOR gate 10 is connected to output terminal 16 and to the Y1 input terminal of gate 12. The Y3 output terminal of gate 12 is connected to output terminal 18 and to the X2 input terminal of gate 10. Either of output terminals 16 or 18 can be utilized as the output terminal for the circuit. As will be seen hereinafter, the signal frequency at the output terminals 16 or 18 is one half the frequency of the signal supplied to input terminal 14.

In order to describe the operation of the circuit shown in FIG. 1, it should first be noted that gates 10 and 12 may either be exclusive OR gates or exclusive NOR gates. The circuits shown in FIGS. 3 and 4 utilize exclusive NOR gates. An exclusive NOR gate is defined as a logic circuit which produces a low level output signal when one and only one of the inputs receives a high level input signal. Conversely, if both of the input signals are the same level (i.e. high level or low level signals) the output signal produced by the logic circuit is a high level signal. In this discussion, high level signals and low level signals are relative terms. Both signals may be positive (or negative) or the high level signal may be positive and the low level signal may be negative.

Figure 2:
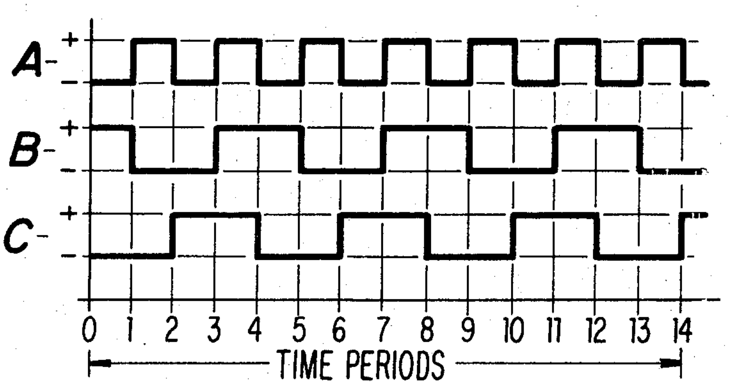
FIG. 2 is a timing diagram showing the wave forms applied to and supplied by the circuit shown in FIGS. 1, 3 and 4.

The operation of the circuit shown in FIG. 1 is more easily understood by making concurrent reference to the timing diagram shown in FIG. 2. Thus, signal A, a periodically recurring signal of frequency F, is supplied to input terminal 14. Signal A is supplied to input terminal X1 of gate 10 and to input terminal Y2 of gate 12. The output signals of the respective gates are supplied to input terminals of the other gate in the circuit as described supra. Thus, at time period TO, input signal A is a low level signal which is applied to input terminals X1 and Y2. For purposes of discussion, it is assumed that signal B (at terminal Y3) is initially at the high level. The high level signal B is supplied to terminal X2 of gate 10. With the application of one and only one high level input signal thereto, gate 10 produces a low level output signal C. This signal is returned to input terminal Y1 of gate 12. Consequently, gate 12 receives two low level signals which cause gate 12 to produce a high level output signal B. Thus, it is seen that the circuit of FIG. 1 is in one stable condition. However, at time period T1, input signal A switches to the high level. Thus, a high level signal is applied to terminals X1 and Y2 of gates 10 and 12 respectively. At time T1, gate 10 has two high level signals applied to the inputs thereof. Gate 12 has one low and one high input signal supplied thereto. Gate 10 is made relatively insensitive to rising inputs and, therefore, cannot change state quickly. Consequently, gate 12 will produce a low level output signal B first. As a result of this operation, at time period T1 signals B and C are each low level signals.

At time period T2, input signal A switches to the low level. The low level signal is applied to terminals X1 and Y2 of gates 10 and 12 respectively. Gate 10 is made relatively more sensitive to falling signals and consequently produces a high level output signal C. The high level signal C is supplied to input terminal Y1 of gate 12 along with the low level signal A. Thus, gate 12 produces a low level output signal B in response to one and only one high level input signal.

At time period T3, the A signal again switches to the high level and is supplied to terminals X1 and Y2 of gates 10 and 12 respectively. The high level signal C is also supplied to terminal Y1 of gate 12 whereby gate 12, sensitive to a rising signal edge, produces a high level output signal B in response to the plurality of high level input signals. The high level signal B is supplied to terminal X2 of gate 10 along with the high level A signal. Consequently, gate 10 produces a high level output signal C.

At time period T4, the input signal A switches to the low level and is supplied to terminals X1 and Y2. The high level signal B is supplied to terminal X2 of gate 10. Gate 10 quickly produces a low level output signal C which is returned to input terminal Y1 of gate 12. The operation of the circuit after time period T4 begins to repeat the circuit operation described from time period TO.

It is seen from the pattern of operation that output signals at terminals 16 or 18 (i.e. the signals C or B respectively) have a frequency which is one half the frequency of the input signal A. That is, for each output pulse at terminal 16 or 18, two input pulses are applied at terminal 14. Moreover, it is seen that the output pulses at B and C are twice the duration of each of the input pulses at A. However, as is well known in the art, signals B and/or C can be operated upon to change the shape thereof in terms of duration of the individual pulses in the event that the pulse duration is of significance.

It should also be understood that in order to obtain the operation described hereinabove, it is a necessary condition that the output of gate 10 must change state prior to the output of gate 12 when the input signal (signal A) is falling (i.e. negative going) on either the X1 or Y2 input terminals. Conversely, the output signal of gate 12 must change state prior to the output signal of gate 10 for an input signal which is rising (i.e. positive going) on the X1 and Y2 input terminals. That is, normally the interconnection of exclusive NOR gates (as shown in FIG. 1) will not produce the output wave forms shown in FIG. 2. Rather, the output signals B or C usually tend to be normal or complementary representations of the input signal at terminal 14 and of the same frequency. The circuit must be forced into the divide-by-two condition in order to provide a frequency divider as suggested herein.

In order to implement the circuit described hereinabove, illustrative embodiments are shown and described hereinafter. Again, the circuits shown in the illustrative embodiments utilize exclusive NOR gates but it should be understood that exclusive OR gates can be utilized as well.

Figure 3:
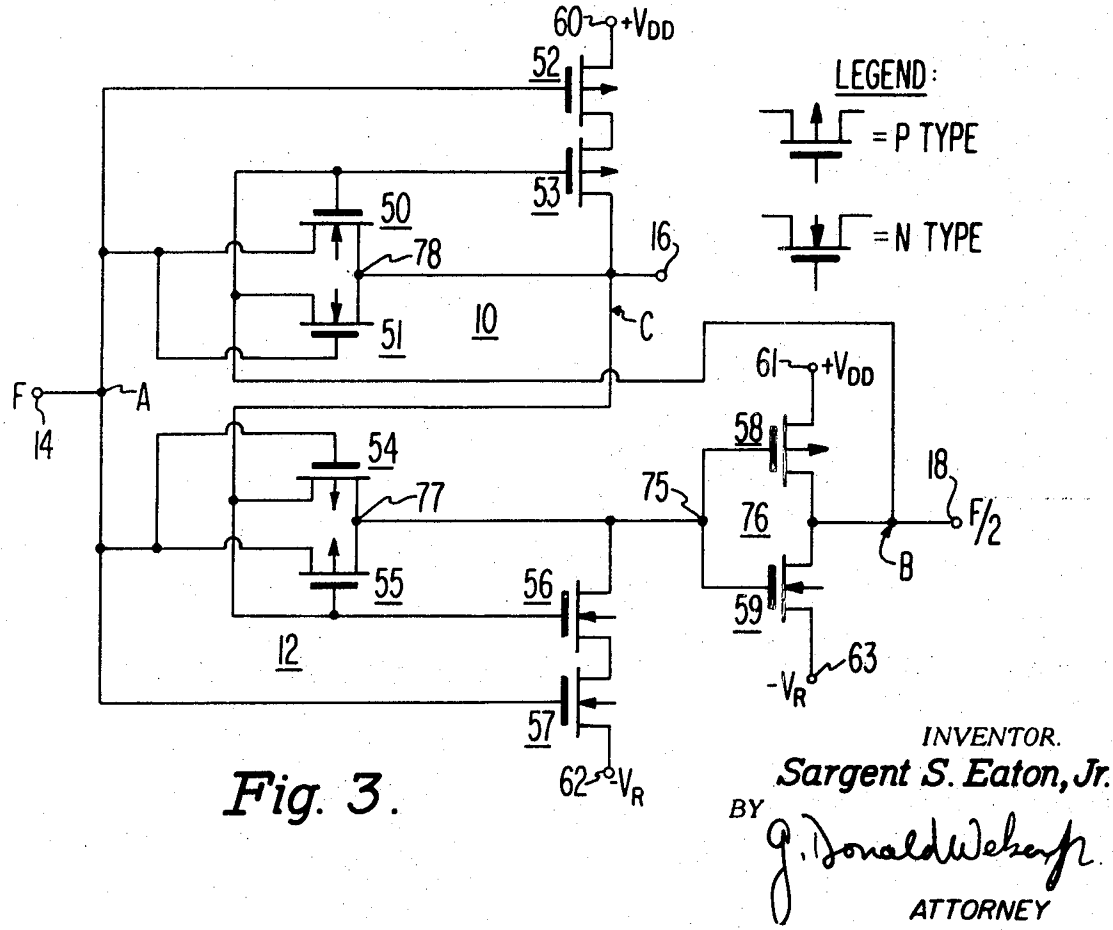
FIG. 3 is a detailed schematic diagram of one embodiment of the instant invention.

Referring now to FIG. 3, one illustrative embodiment of the instant invention is shown in detailed schematic diagram form. This schematic diagram includes a plurality of semiconductor devices of the MOS type. These semiconductor devices are the known type which include a conduction path between two electrodes (commonly referred to as the source and drain electrodes) and a control electrode which controls the conduction through the conduction path. The control electrode is frequently referred to as the gate electrode. In addition, as is suggested by the legend, there are P-type (PMOS) and N-type (NMOS) MOS devices. These types of devices are well known in the art. However, very generally, the P-type MOS device of the enhancement type is rendered conductive when the gate electrode is made negative relative to the source electrode thereof. Conversely, the N-type MOS device of the enhancement type is made conductive when the gate electrode is made positive relative to the source electrode thereof. Moreover, inasmuch as these devices are generally bilateral in operation, the source or drain electrode thereof is not necessarily defined with specificity. Rather, the devices are effectively defined as being conductive or nonconductive, in accordance with the signal condition at the gate electrode vis-a-vis the signal condition at one of the terminals of the conduction path thereof. In fact, the device may be considered to be enabled by the appropriate signal at the gate electrode, and conduction (and direction thereof) prescribed by the signal conditions at the conduction path terminals.

The input signal A of frequency F is supplied to terminal 14 as was the case with the circuit shown in FIG. 1. This signal is supplied to the gate electrode of PMOS device 52 as well as to the gate electrode of NMOS device 57. In addition, signal A is supplied to the gate electrodes of PMOS device 54 and NMOS device 51. The signal A is also supplied to one terminal of the conduction path of NMOS device 50 and PMOS device 55. One terminal of the conduction path of PMOS device 52 is connected to a suitable source $+V_{DD}$ at terminal 60. Another terminal of the conduction path of PMOS device 52 is connected to one terminal of the conduction path of PMOS device 53. The other terminal of the conduction path of PMOS device 53 is connected to output terminal 16 and to common junction 78 at the second terminal of the conduction path of NMOS device 50 and a terminal of the conduction path of NMOS device 51. The other terminal of the conduction path of NMOS device 51 is connected to the gate electrodes of NMOS device 50 and PMOS device 53. In addition, the second mentioned terminal of the conduction path of semiconductor device 52 is connected to output terminal 18 whereby signal B is returned thereto.

The second terminal of the conduction path of PMOS device 53 (i.e. output terminal 16) is connected to one terminal of the conduction path of PMOS device 54 whereby signal C is supplied thereto. In addition, this terminal of the conduction path of PMOS device 54 is connected to the gate electrodes of PMOS device 55 and NMOS device 56. The conduction paths of NMOS devices 56 and 57 are connected in series between terminal 62, which receives a signal $-V_R$ (which may be on the order of ground potential) and a common junction 77 between terminals of the conduction paths of PMOS devices 54 and 55.

In addition, common junction 77 (at the terminals of the conduction paths of semiconductors 54, 55 and 56) is connected at common junction 75 to the gate electrodes of PMOS device 58 and NMOS device 59. The conduction paths of devices 58 and 59 are connected in series between terminals 61 and 63. Terminals 61 and 63 are connected to the sources $+V_{DD}$ and $-V_R$ respectively. The common junction of the conduction paths of devices 58 and 59 is connected to output terminal 18 at which point the output signal F/2 is detected. This output signal is representative of the signal B shown in FIG. 2. Moreover, devices 58 and 59 form a typical inverter circuit 76.

Operation of this circuit is similar to the operation of the circuit shown in FIG. 1. Therefore, concurrent reference is made to the timing diagram of FIG. 2 in order to understand the operation of the circuit of FIG. 3. Signal A is supplied to terminal 14 and from there to the gate electrodes of devices 52 and 57, the gate electrodes of devices 51 and 54 and the conduction path terminals of devices 50 and 55. At time TO, signal A is a low level signal. Consequently, NMOS devices 57 and 51 are rendered nonconductive due to the application of the low level signal to the gate electrodes thereof. Conversely, PMOS devices 52 and 54 are rendered conductive by the same low level signal at the gate electrodes thereof. As a starting point, signal B is defined to be a high level signal which is supplied to the gate electrode of devices 50 and 53 as well as to a terminal of the conduction path of device 51. Device 50 is then conductive and will cause a low level signal to be supplied to the gate electrodes of devices 55 and 56 and to terminals of the conduction paths of devices 50 and 51 (at junction 78) and device 54. With these signal combinations, PMOS devices 54 and 55 are rendered conductive whereby low level signal C is transmitted therethrough to terminal 75 of inverter 76 whereby a high level output signal is supplied to terminal 18. That is, the low level signal at terminal 75 renders semiconductor device 58 conductive and device 59 nonconductive. Consequently, output terminal 18 is connected via the conduction path of device 58 to terminal 61 which is defined as a relatively positive source. Similarly, because of the signal combinations, device 57 is nonconductive whereby the signal condition of device 56 (connected in series with device 57) is inconsequential. Furthermore, the signal combinations described at time period T0 render device 53 nonconductive and device 52 conductive. Therefore, source $+V_{DD}$ at terminal 60 is not connected to terminal 16.

At time period T1, input signal A switches to the high level. Consequently, a high level signal is supplied to the gate electrode of device 52 and device 51. Similarly, the high level signal A is supplied to the gate electrode of device 54 and device 57. The high level signal A is also supplied to one terminal of the conduction path of each of devices 50 and 55, respectively. In accordance with the conditions stated supra, a rising input signal (signal A) requires that the output signal at terminal B change prior to the output signal at terminal C. Consequently, device 55 operates in response to the combination of the high level signal applied to the conduction path at time T1 and the low level signal already applied at the gate electrode thereof to conduct the high level signal to node 75 substantially immediately upon application of the high level input signal. (Because of the high level signal at the gate electrode thereof, device 54 is substantially non-conductive.) The high level signal at node 75 is inverted by inverter 76 and supplied as low level signal B to terminal 18. The low level signal B is supplied to the gate electrode of devices 50 and 53 whereby device 50 is rendered nonconductive and device 53 is enabled for conduction depending upon the remainder of the signals applied thereto. High level signal A, which was applied to the gate electrode of device 51, causes this device to be enabled such that the application of low level signal B to the conduction path thereof is essentially operative to provide a low level signal C at terminal 16. Low level signal C is fed back to the gate electrode of device 55 to, essentially, latch the circuit in the conditions enumerated. In addition, low level signal C is supplied to the conduction path of device 54 which is rendered nonconductive by high level signal A at the gate electrode thereof. In addition, low level signal C is supplied to the gate electrode of device 56 which is rendered nonconductive thereby. Thus, it is seen that the high level signal A produces low level signals B and C at time period T1.

At time period T2, signal A switches to the low level and this low level signal is supplied to the gate electrodes of devices 52 and 57 as well as devices 51 and 54. In this situation, the input signal is a falling signal wherein the output signal at terminal 16 (signal C) must change state before the output signal of the other gate. Thus, the application of low level signal A to the gate electrode of device 52 causes conduction through series connected devices 52 and 53 whereby a high level signal C is produced at terminal 16. Signal C then produces a high level signal at the conduction path of device 54 which has been rendered conductive by low level signal A. Thus, a high level signal is applied to terminal 75 via device 54. In addition, device 57 has been rendered nonconductive by low level signal A whereby source $-V_R$ at terminal 62 is disconnected from terminal 75.

Inverter 76 operates upon the signal at terminal 75 and produces low level signal B at terminal 18 which signal B is returned to the conduction path of device 51. However, device 51 has already been rendered nonconductive by the application of low level signal A to the gate electrode thereof. In addition, low level signal B is supplied to the gate electrodes of devices 50 and 53 whereby device 50 is rendered nonconductive and device 53 is rendered conductive. These signal conditions cause the circuit to latch in the condition shown. Thus, at time period T2 signals A and B are low level signals while the signal C is a high level signal.

At time period T3, input signal A switches again to the high level. This high level signal is supplied to the gate electrode of each of devices 52, 51, 57 and 54. Again, inasmuch as it is a rising input signal, the condition that the output signal of gate 12 must change state prior to the output signal of gate 10 exists. At this time, high level signals are supplied to the gate electrodes of devices 56 and 57 concurrently whereby these devices transfer a low level signal from terminal 62 to terminal 75. Inverter 76 operates upon this low level signal and produces a high level output signal B at terminal 18. Low level signal B is applied to the gate electrode of devices 50 and 53 whereby device 50 is conductive and the high level signal A at the conduction path thereof is conducted therethrough to terminal 16 while device 53 is rendered nonconductive. These signal conditions are sufficient to cause the circuit to latch in the condition described. Thus, at time period T3, signals A, B and C are all high level signals.

At time period T4, input signal A switches to the low level. Signal B remains at the high level and signal C switches to the low level. That is, a falling input signal requires that the output signal of gate 10 switch prior to the output signal of gate 12. In this case, device 50 (enabled by high level signal B) transmits low level signal A to terminal 16. These signal conditions are noted to be the same as the signal conditions at time period TO. Consequently, the circuit now operates as at time period T0 and cyclically repeats the operation previously described.

Thus, it is seen that output signals B and C are, as defined supra relative to FIG. 1, cyclic signals which are regularly recurring and have frequency F/2 where frequency F is the frequency of input signal A. Consequently, a frequency divider is provided utilizing COS/MOS techniques, and thereby having little power dissipation as well as requiring small integrated circuit chip area.

As noted supra, the requirements that the output of gate 10 must change prior to the output of gate 12 for a falling input while the output of gate 12 must change before the output of gate 10 for a rising input are applied. To ensure that these conditions are established, the circuit shown in FIG. 3 is constructed with appropriate choice of device sizes. The relationship to be established between the several devices is explained herein. The sizes of the devices control the relative impedances of the devices. The impedance of each device is represented by the letter Z with the subscript equivalent to the device reference numeral. One way to assure that appropriate circuit conditions and parameters are provided is to use transistors which have the relative impedances listed herewith:

$$Z_{55} + Z_{59} < [(Z_{50}Z_{51})/(Z_{50} + Z_{51})] \qquad \text{I.}$$
$$Z_{52} + Z_{53} < [(Z_{54}Z_{55})/(Z_{54} + Z_{55})] + Z_{58} \qquad \text{II.}$$
$$Z_{56} + Z_{57} + Z_{58} < Z_{51} \qquad \text{III.}$$
$$Z_{50} < Z_{54} + Z_{59} \qquad \text{IV.}$$

One solution or arrangement of device impedances (normalized re.$Z_{51}$) for satisfying these conditions is as follows:

$$Z_{51} = .5\ Z_{54}$$
$$Z_{51} = 10\ Z_{59} = 10(Z_{52} + Z_{53})$$
$$Z_{51} = 4\ Z_{58} = 4\ Z_{55}$$
$$Z_{51} = 2(Z_{56} + Z_{57})$$
$$Z_{51} = Z_{50}$$

Conditions I and II above occur when input signals X1 and X2 (input signals to gate 10) are both logical ones and input signals Y1 and Y2 (input signals to gate 12) are both logical zeros. However, because of the substrate effect in each of these conditions, both modes of operation are naturally slow. This slow operation is beneficial inasmuch as it is desired that the appropriate devices operate slowly during these conditions. Consequently, while conditions I and II are desirable, they are not rigid rules. In fact, the circuit would work satisfactorily even if $$Z_{55} + Z_{59} = [(Z_{50}Z_{51})/(Z_{50} + Z_{51})]$$

and $$Z_{52} + Z_{53} = [(Z_{54}Z_{55})/(Z_{54} + Z_{55})] + Z_{58}$$

Figure 4:
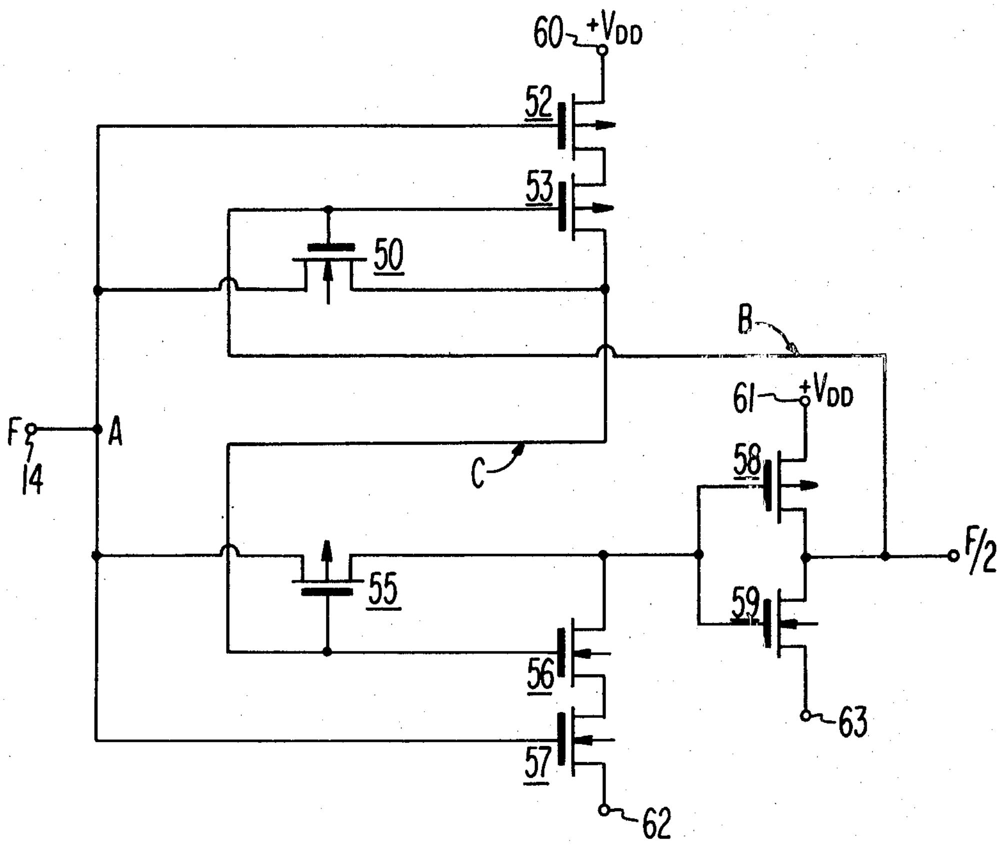
FIG. 4 is a detailed schematic diagram of another embodiment of the instant invention.

Referring now to FIG. 3, there is shown another embodiment of the instant invention. The circuit embodiment shown in FIG. 4 is substantially similar to the circuit embodiment shown in FIG. 3 with the exception that semiconductor devices 51 and 54 have been omitted. By reviewing the conditions set forth above, and the description of the operation of the circuit shown in FIG. 3, is is apparent that semiconductors 51 and 54 need never be low impedances in order to have the circuit operate properly. It is a corollary that they may be (and may remain) high impedances. If the devices may be high impedances, it is only an extension thereof to define these impedances to be infinite and, ultimately, to remove the devices from the circuit. With these devices removed, the operation described supra substantially applies to the circuit shown in FIG. 4. However, the circuit now becomes an eight device dynamic counting stage which has even fewer devices or transistors which further reduces the chip area requirements and maintains the power consumption at a relatively low rate.

A detailed description of the operation of the circuit shown in FIG. 4 is deemed unnecessary. Reference to the discussion of the operation of the circuit shown in FIG. 3 is believed to satisfactorily define the operation of the circuit of FIG. 4. The circuit of FIG. 4 will operate in the same manner whereby the timing diagram of FIG. 2 is applicable to this circuit as well.

Thus, there is shown and described a relatively simple frequency divider network utilizing a relatively small number of semiconductor devices. This circuit, when implemented in integrated circuit form, has reduced requirements for (a) chip area and (b) power dissipation. The power dissipation is, obviously, reduced inasmuch as there is only one actual continuous positive source to negative source current path (i.e. inverter 76). Moreover, by utilizing less chip area in an integrated circuit application, the inherent advantages of smaller chip area utilization are obtained.

In addition, it is to be understood that the circuits shown and described hereinabove are illustrative embodiments only. The embodiments shown include exclusive NOR gates. However, exclusive OR gates may be utilized. Moreover, in the specific applications shown, those skilled in the art may devise modifications thereto. However, so long as these modifications fall within the purview of the invention as described, the changes are intended to fall within this description.

What is claimed is:

1. A divider circuit comprising, in combination:

first and second two input logic gates, each of the type producing an output signal representing one binary value whenever the two input signals to that gate represent the same binary value and representing the other binary value whenever the two input signals to that gate represent different binary values;

a common input signal terminal connected to one input terminal of both gates;

a connection from the output terminal of the first gate to the other input terminal of the second gate; and a connection from the output terminal of the second gate to the other input terminal of the first gate.

2. The divider circuit recited in claim 1 wherein each of said first and second logic gates is an exclusive OR gate.

3. The divider circuit recited in claim 1 wherein each of said first and second logic gates is an exclusive NOR gate.

4. The divider circuit recited in claim 1 wherein each of said first and second logic gates includes a plurality of semiconductor devices, and said first logic gate changes state more rapidly than said second logic gate in response to a falling portion of the signal supplied to said common input signal terminal, and said second logic gate changes state more rapidly than said first logic gate in response to a rising portion of the signal supplied to said common input signal terminal.

5. The divider circuit recited in claim 1 wherein at least one of said logic gates includes inverter means at the output thereof.

6. The divider circuit recited in claim 1 wherein each of said logic gates includes first and second semiconductor devices of one conductivity type, each of said first and second semiconductor devices having a conduction path with a terminal at each end thereof and a gate electrode for controlling the conduction through said conduction path, said first and second semiconductor devices having a common connection at one terminal of the conduction paths thereof, reference source means, third and fourth semiconductor devices of the opposite conductivity type, each of said third and fourth semiconductor devices having a conduction path with a terminal at each end thereof and a gate electrode for controlling the conduction through said conduction path, said third and forth semiconductor devices having the conduction paths thereof connected in series between said common connection and said reference source means, the gate electrodes of said first and third semiconductor devices and one end of the conduction path of said second semiconductor device connected to said source means, and the gate electrodes of said second and fourth semiconductor devices and one end of the conduction path of said first semiconductor device connected to the output terminal of the other logic gate, said output terminal of each gate being connected to said common connection of the associated logic gate.

7. The divider circuit recited in claim 1 wherein each of said logic gates includes first semiconductor means, a conduction path with a terminal at each end thereof and a control electrode for controlling the conduction through said conduction path, said first semiconductor device having the conduction path thereof connected between said source means and said output terminal, reference source means, second and third semiconductor means each having a conduction path with a terminal at each end thereof and a control electrode for controlling the conduction through said conduction path, said second and third semiconductor devices having the conduction paths thereof connected in series between said output terminal and said reference source means, the control electrodes of said first and second semiconductor means connected to the output terminal of the other logic gate, the control electrode of said third semiconductor means connected to said source means, said first semiconductor means being of one conductivity type, and said second and third semiconductor means being of another conductivity type.

8. The frequency divider recited in claim 6 including inverter means connected between said one terminal in one of said logic gates and the gate electrode of said second and fourth semiconductor devices of the other logic gate.

9. A divider circuit as set forth in claim 1 wherein each gate comprises a plurality of metal oxide semiconductor devices.

10. A divider circuit as set forth in claim 9 wherein each gate comprises complementary-symmetry, metal oxide semiconductor devices.

* * * * *